United States Patent [19]
Tanaka

[11] Patent Number: 5,557,172
[45] Date of Patent: Sep. 17, 1996

[54] PLASMA BEAM GENERATING METHOD AND APPARATUS WHICH CAN GENERATE A HIGH-POWER PLASMA BEAM

[75] Inventor: Masaru Tanaka, Ehime, Japan

[73] Assignee: Sumitomo Heavy Industries, Ltd., Tokyo, Japan

[21] Appl. No.: 359,543

[22] Filed: Dec. 20, 1994

[30] Foreign Application Priority Data

Dec. 21, 1993 [JP] Japan ............... 5-322455
Dec. 24, 1993 [JP] Japan ............... 5-328698
Dec. 27, 1993 [JP] Japan ............... 5-333562

[51] Int. Cl.$^6$ .................................. H01J 7/24
[52] U.S. Cl. .................. 315/111.71; 315/111.81
[58] Field of Search .................. 315/111.21, 111.31, 315/111.41, 111.51, 111.61, 111.71, 111.81; 250/492.3, 492.1, 396 R

[56] References Cited

U.S. PATENT DOCUMENTS 5,296,714  3/1994  Treglio .................. 315/111.41

FOREIGN PATENT DOCUMENTS

| 0284436A2 | 9/1988 | European Pat. Off. . | |
|---|---|---|---|
| 0403418A2 | 12/1990 | European Pat. Off. . | |
| 0429251A2 | 5/1991 | European Pat. Off. . | |
| 52-72155 | 6/1977 | Japan . | |
| 200529 | 11/1983 | Japan | 315/111.21 |
| 2130279 | 6/1987 | Japan | 315/111.21 |
| 5021392 | 1/1993 | Japan | 315/111.61 |

OTHER PUBLICATIONS

"Control of reactive plasmas in a multicusp plasma source equipped with a movable magnetic filter", by Osamu Fukumasa et al, Journal of Applied Physics, 74(2), Jul. 15, 1993, pp. 848–852.

Primary Examiner—Robert Pascal
Assistant Examiner—Michael B. Shingleton
Attorney, Agent, or Firm—Burns, Doane, Swecker & Mathis, L.L.P.

[57] ABSTRACT

In a plasma beam generating apparatus comprising a plasma source and an anode portion for receiving a plasma beam, a magnetic field generating device is arranged between the plasma source and the anode portion along an orbit of the plasma beam to generate magnetic field having magnetic gradient such that space charges are generated. The magnetic field generating device accelerates electron flow in the plasma beam to supply accelerated electron flow to the anode portion.

13 Claims, 9 Drawing Sheets

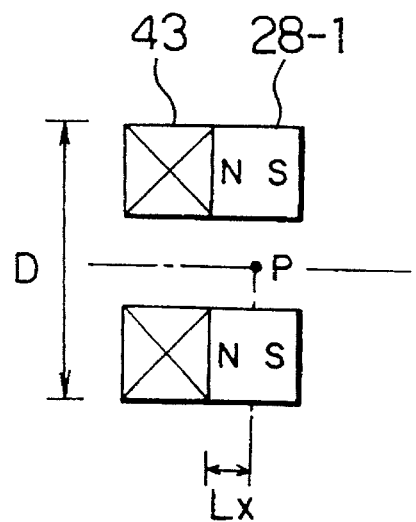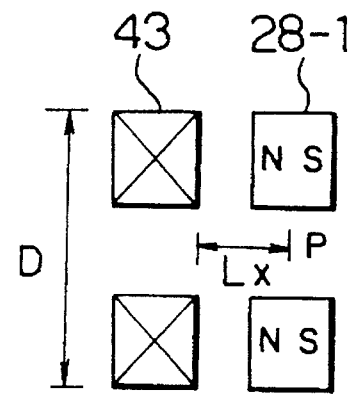
FIG. 15  FIG. 16
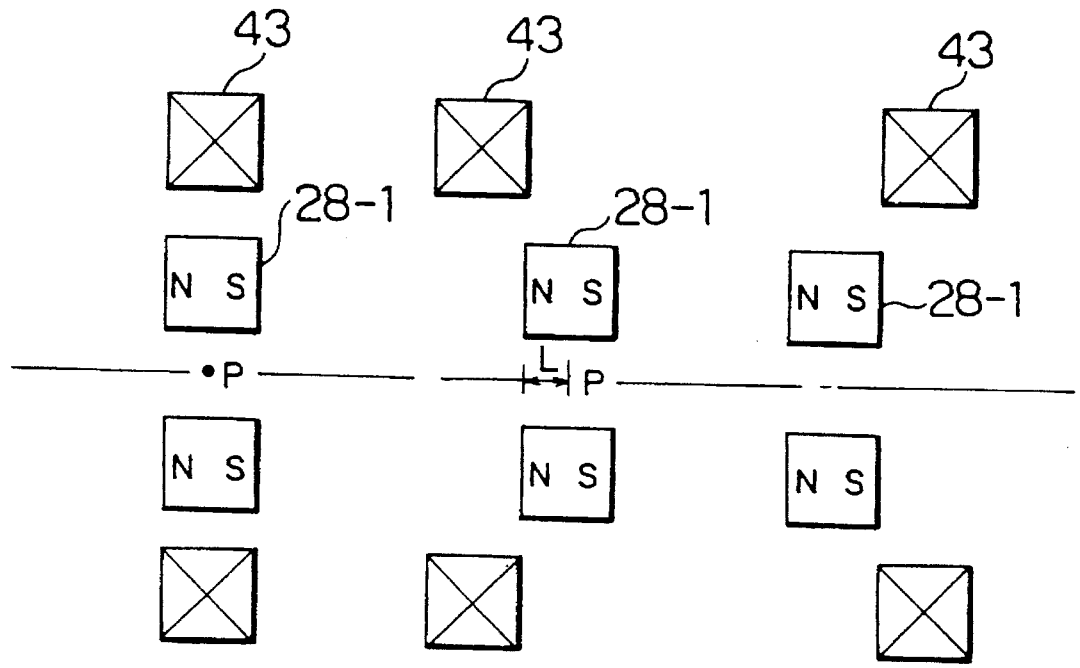
FIG. 17  FIG. 18  FIG. 19

PLASMA BEAM GENERATING METHOD AND APPARATUS WHICH CAN GENERATE A HIGH-POWER PLASMA BEAM

BACKGROUND OF THE INVENTION

This invention relates to a plasma beam generating method and its generating apparatus, which can generate and control a plasma beam of high energy.

In general, a plasma beam generating apparatus comprises a chamber for defining a discharge space, a plasma source mounted on the chamber to generate a plasma beam, a first magnetic field generating device for generating a first magnetic field to guide the plasma beam generated by the plasma source into the chamber, and an anode portion located within the chamber to receive the plasma beam. The plasma source is generally implemented by a heated cathode.

With respect to the above-mentioned plasma beam generating apparatus, it is recently required to generate a plasma beam of high energy. In order to fulfill such a requirement, it is preferable that a heavy-current discharge, namely, a large-current discharge is carried out at a low voltage in the plasma source.

In order to carry out the heavy-current discharge as mentioned above, a special plasma source is required. However, when the special plasma source is used, the plasma beam generating apparatus becomes complex in structure and expensive in cost. In addition, when the heavy-current discharge is carried out, a large capacity of a carrier gas (for example, argon gas or helium gas) is required and pumping speed thereof must be high. Also from those standpoints, the plasma beam generating apparatus becomes bulky and complex. Additionally, since an operation is carried out under hard conditions, damage to the cathode is increased.

On the other hand, if the plasma source can carry out the heavy-current discharge, it becomes possible to carry out a heavy-current and heavy-voltage discharge. This means that supply energy can be rapidly increased. In order to increase a discharge voltage, it is considered that an electron gun is used as the plasma source. An example of the electron gun is disclosed in Japanese Unexamined Patent Prepublication No. 72155/1977. When the electron gun is used, however, it is necessary that an exhausting section of carrier gas is formed in a large scale or a plurality of exhausting pumps are prepared. As a result, this brings a disadvantage that a capacity of the carrier gas becomes large in addition that the plasma beam generating apparatus becomes a large scale in structure. Furthermore, there is another disadvantage that a plasma state becomes unstable.

SUMMARY OF THE INVENTION

It is an object of this invention to provide a plasma beam generating method which is capable of stably generating and controlling a plasma beam.

It is another object of this invention to provide a plasma beam generating apparatus which has a simple structure and which is suitable for the above-mentioned method.

On describing the gist of this invention, it is possible to understand that a plasma beam generating method is for generating a plasma beam from a plasma source towards an anode portion arranged within a chamber. According to a first invention, a magnetic field generating member is arranged along an orbit of the plasma beam within the chamber for generating magnetic field having magnetic gradient such that space charges are generated. The magnetic field generating member accelerates electron flow within the plasma beam.

It is possible to understand that a plasma beam generating apparatus comprises a chamber for defining a discharge space, a plasma source mounted on the chamber to generate a plasma beam, a first magnetic field generating member mounted on the plasma source for rendering plasma into a beam to introduce the beam into the chamber, and an anode portion arranged within the chamber to receive the plasma beam. According to a second invention, a second magnetic field generating member is arranged within the chamber along an orbit of the plasma beam to generate magnetic field having magnetic gradient such that space charges are generated. The second magnetic field generating member accelerates electron flow in the plasma beam to supply accelerated electron flow to the anode portion.

BRIEF DESCRIPTION OF THE DRAWING

FIG. 15 is a view for showing another example of the positional relationship between the magnetic field generating device and the electromagnetic coil illustrated in FIG. 13;

FIG. 16 is a view for showing still another example of the positional relationship between the magnetic field generating device and the electromagnetic coil illustrated in FIG. 13;

FIG. 17 is a view for showing another example of a combination of the magnetic field generating device and the electromagnetic coil illustrated in FIG. 13;

FIG. 18 is a view for showing still another example of the combination of the magnetic field generating device and the electromagnetic coil illustrated in FIG. 13;

FIG. 19 is a view for showing yet another example of the combination of the magnetic field generating device and the electromagnetic coil illustrated in FIG. 13;

DESCRIPTION OF THE PREFERRED EMBODIMENT

Figure 1:
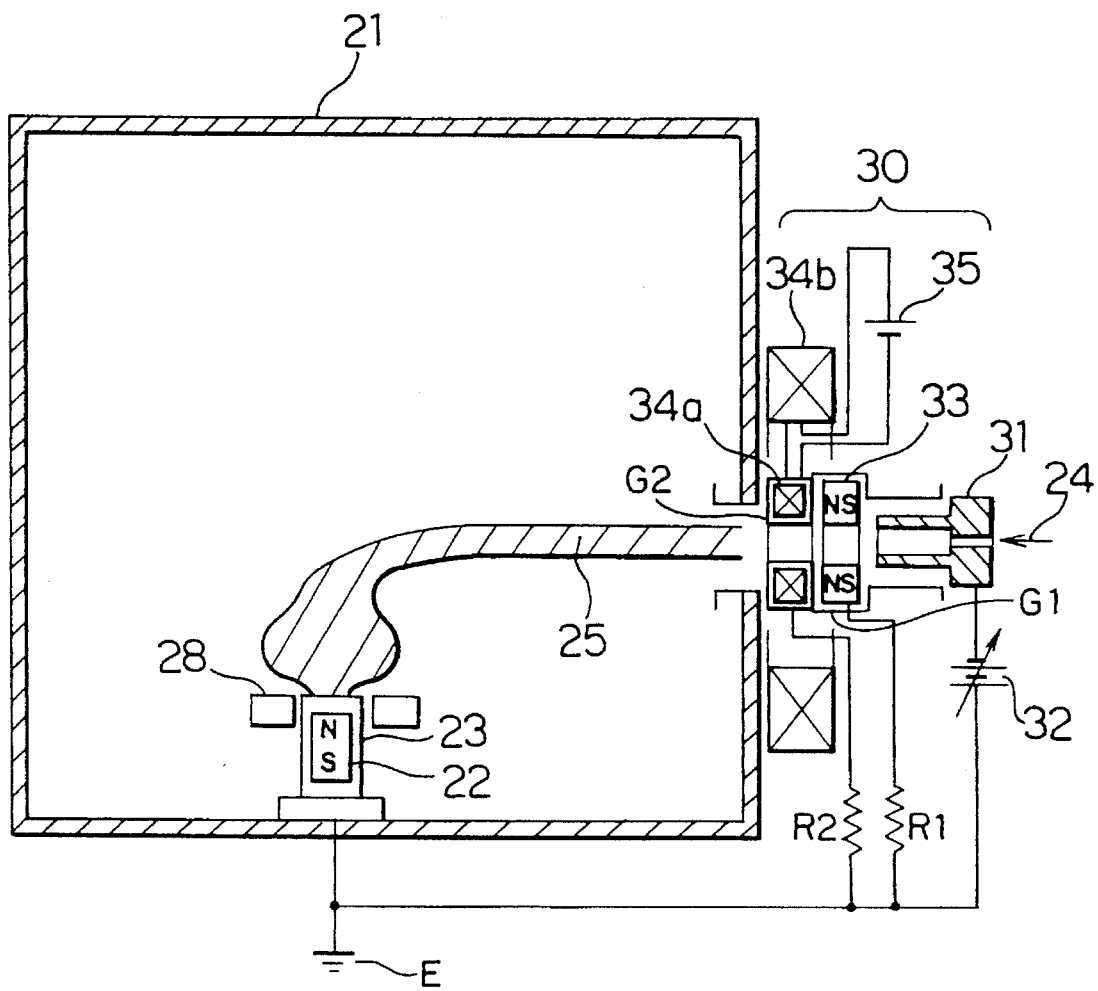
FIG. 1 is a sectional view of a plasma beam generating apparatus according to a first embodiment of this invention.

With reference to FIG. 1, description will be made as regards a plasma beam generating apparatus according to a first embodiment of this invention. The plasma beam generating apparatus comprises a chamber 21. At the bottom of the chamber 21, an anode 23 containing a permanent magnet 22 is located to guide a plasma beam. At a side wall of the chamber 21, a cathode 31 which forms a part of a plasma source 30 is arranged. Between the anode 23 and the cathode 31, a discharge space is defined within the chamber 21. The anode 23 and the cathode 31 are connected to a discharge power supply 32 located outside the chamber 21. At the central portion of the cathode 31, a central hole is formed so that carrier gas 24 such as argon gas or helium gas is introduced therethrough into the chamber 21. The plasma source 30 comprises, in addition to the cathode 31, a permanent magnet 33 contained in a grid electrode G1 for converging a beam, a coil 34a contained in a grid electrode G2, a steering coil 34b, and a steering power supply 35 for exciting the coil 34a and the steering coil 34b. The permanent magnet 33 and the coil 34a are connected to the discharge power supply 32 through drooping resistances R1 and R2. A combination of the coil 34a, the steering coil 34b, and the steering power supply 35 may be called a first magnetic field generating device.

In the above-mentioned structure, when an electron is emitted from the cathode 31, a plasma is generated within the discharge space. The plasma is converged by the permanent magnet 33 and then guided by the coil 34a and the steering coil 34b to be introduced, as a plasma beam 25, into the chamber 21. The plasma beam 25 introduced into the chamber 21 directs towards the anode 23.

In the plasma beam generating apparatus according to this invention, a magnetic field generating device 28 is formed between the plasma source 30 and the anode 23. The magnetic field generating device 28 produces, along an orbit of the plasma beam 25, a magnetic field having a cusp-shaped or a mirror-shaped magnetic gradient in the vicinity thereof. The magnetic field generating device 28 may be called a second magnetic field generating device.

The magnetic gradient produced by the magnetic field generating device 28 impedes a flow of the plasma beam 25 at a side or both sides of the magnetic field generating device 28. This renders the plasma beam 25 into a semi-confinement state. In the plasma beam 25 in the semi-confinement state, a state that an electron density n is higher than an ion density $n_i$, namely, a state of $n_e \geq n_i$ is generated due to thermal diffusion.

This state causes negative space charges for an electron flow, so that a discharge voltage is increased. In addition, if neutralizing gas and neutralizing particles are infused from an end portion of the confined plasma, a difference between the electron density and the ion density in a space becomes large ($n_e > n_i$). This results in an increase of the discharge voltage.

In this event, the magnetic field generating device 28 for rendering the plasma beam into the semi-confinement state is for impeding the electron flow and is different from the magnetic field generating device such as the coil 34a and the steering coil 34b for modifying an orbit of an electron beam or guiding the plasma beam. On account of this, the magnetic field generating device 28 may be made of, in comparison with the other magnetic field generating devices, a permanent magnet or a plurality of electromagnets such that a magnetic gradient rapidly variable along the orbit of the plasma beam 25 is generated. It has been experimentally found out that when the plasma beam is provided with a magnetic gradient not less than 100G/cm by the magnetic field generating device 28, the semi-confinement state of the plasma beam can be obtained.

Additionally, in FIG. 1, the anode 23 may be formed at the internal wall which is opposite to the plasma source 30, of the chamber 21. In this event, the magnetic field generating device 28 may be located between the plasma source 30 and the anode 23 along the orbit of the plasma beam 25.

Figure 2:
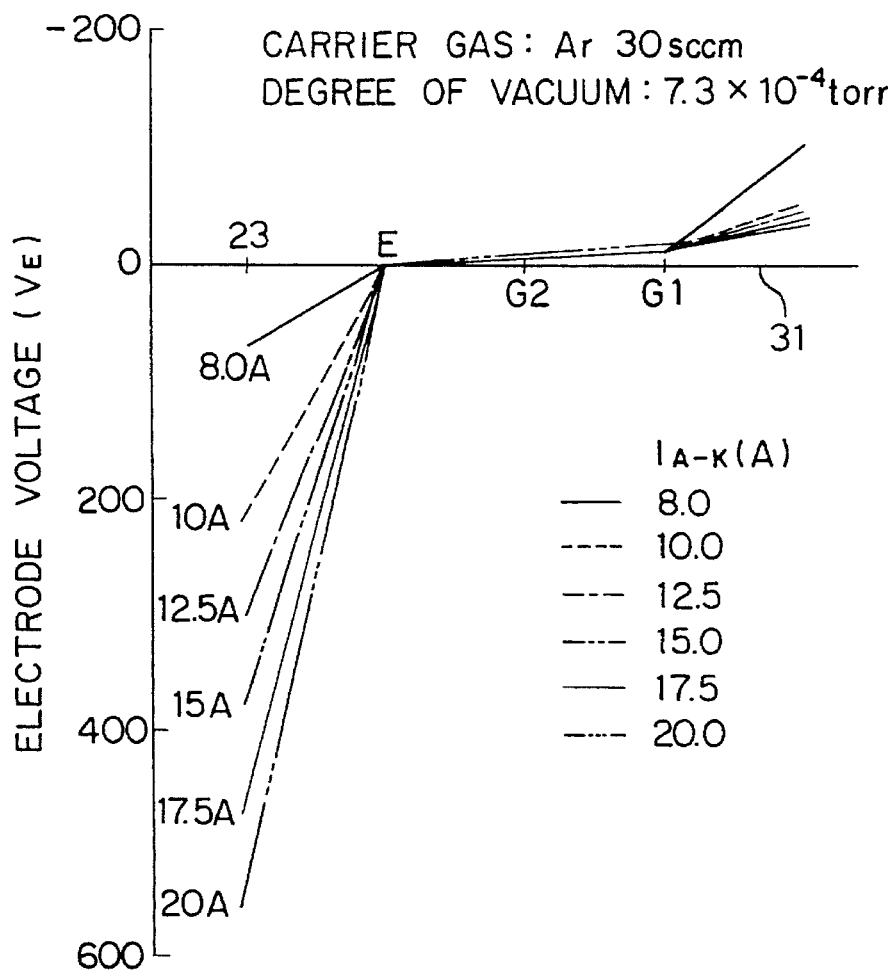
FIG. 2 is a view for describing a characteristic of the plasma beam generating apparatus illustrated in FIG. 1.

With reference to FIG. 2, a relationship between each voltage of portions from the cathode 31 to the anode 23, and an electric current which flows into the anode 23 is shown. As apparent from FIG. 2, the voltage is greatly increased between the grid electrode G2 of the cathode 31 and the anode 23. On the other hand, it is understood that the larger the electric current is, the higher the voltage of the anode 23 becomes. In an example illustrated in the figure, with respect to a discharge current of 20A, a high discharge voltage approximately equal to 550 (V) is recorded. Incidentally, in a conventional beam generating apparatus, even in a case of a discharge current of 250 (A), it is merely possible to obtain the discharge voltage of 80 to 100 (V) or the like.

Figure 3:
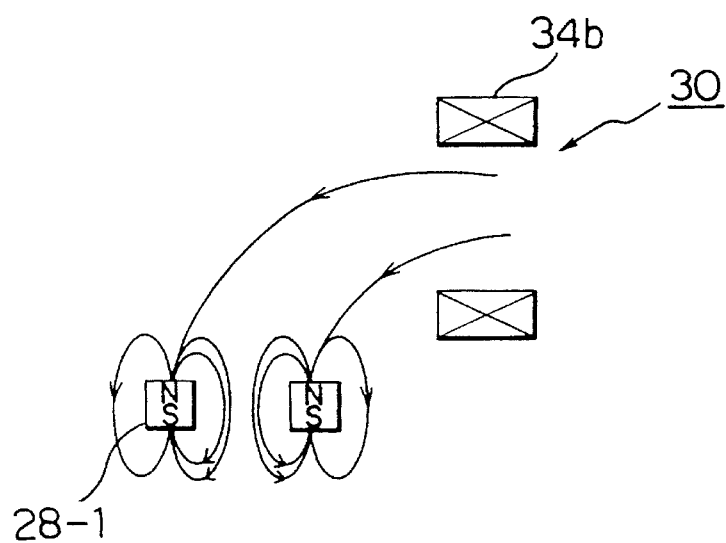
FIG. 3 is a view for describing an effect of a magnetic field generating device illustrated in FIG. 1.

Referring to FIG. 3, the magnetic field generating device 28 is made of an annular permanent magnet 28-1. The permanent magnet 28-1 has the N pole at one end and the S pole at the other end thereof in an axial direction and faces the N pole towards the upper direction. In a case that use is made of the above-mentioned permanent magnet 28-1, a cusp-shaped magnetic field is generated around the permanent magnet 28-1, so that it is possible to thereby render the plasma beam into the semi-confinement state. When the cusp-shaped magnetic field is generated, lines of magnetic force are generated so as to pass through the inner space of the permanent magnet 28-1 as shown by arrow lines. Moreover, lines of magnetic force facing from the N pole towards the S pole are also generated in the outer space of the permanent magnet 28-1. With the above-mentioned cusp-shaped magnetic field, the inner space of the permanent magnet 28-1 serves as an end portion for confining the plasma beam. In this state, the electron density $n_e$ becomes higher in the side of the plasma source 30 with respect to the permanent magnet 28-1 and moreover the electron flow passed through the inner space of the permanent magnet 28-1 and through a negative charged space is accelerated to be transmitted to the side of the anode 23. Accordingly, it is possible to obtain an accelerated high-power and heavy-current plasma beam by locating the permanent magnet 28-1 along the plasma beam. The permanent magnet 28-1 may be referred to as a first permanent magnet.

Figure 4:
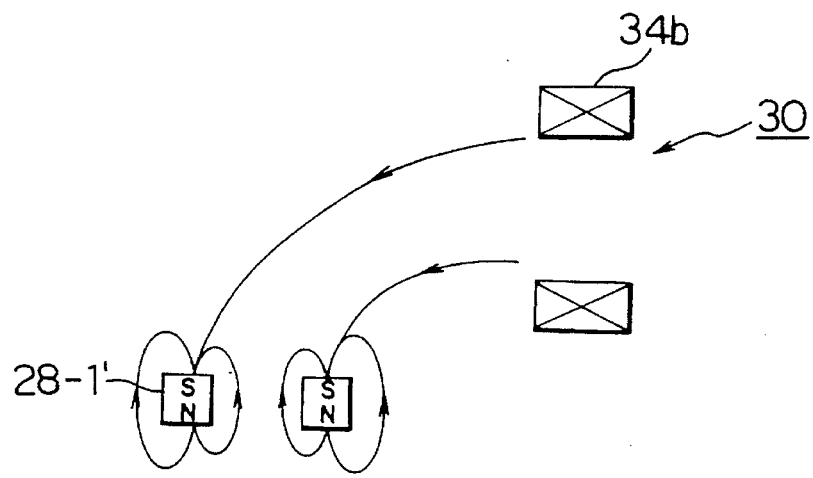
FIG. 4 is a view for showing a modification of the magnetic field generating device illustrated in FIG. 3.

With reference to FIG. 4, description will now be made as regards another example of the magnetic field generating device 28. In this event, a polarity of a permanent magnet 28-1' is inversed from that of the permanent magnet 28-1 illustrated in FIG. 3. In other words, the permanent magnet 28-1' faces the S pole thereof to the upper side direction and the N pole thereof to the down side direction, namely, towards the anode. It is also found out according to this case that the cusp-shaped magnetic field is generated by the permanent magnet 28-1' so as to thereby render the plasma beam into the semi-confinement state as similar as the case of FIG. 3.

Figure 5:
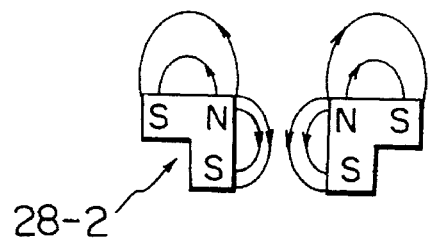
FIG. 5 is a view for showing another example of the magnetic field generating device illustrated in FIG. 1.

In FIG. 5, description will be made as regards still another example of the magnetic field generating device 28. In this example, the cusp-shaped magnetic field is generated by a composite permanent magnet 28-2. The composite permanent magnet 28-2 has an annular shape having an opening in the central portion thereof. The upper inner-diameter-side of the composite permanent magnet is magnetized by the N pole while the upper outer-diameter-side thereof is magnetized by the S pole. On the other hand, the lower portion of the composite permanent magnet 28-2 is magnetized by the S pole. Consequently, in the vertical direction, lines of magnetic force extend from the inner side to the outer side. This makes it possible to render the plasma beam into the semi-confinement state. Additionally, in the opening of the composite permanent magnet 28-2, lines of magnetic force are generated to extend from the upper portion to the lower portion thereof so as to be able to restrict the electron flow which passes through the opening. Thus, the composite permanent magnet 28-2 with the above-mentioned structure can also be used in generating the high-power plasma beam.

The composite permanent magnet 28-2 illustrated in FIG. 5 can be obtained by magnetizing a single magnetic member. Furthermore, the composite permanent magnet 28-2 may be formed by stacking a plurality of permanent magnets. In addition, according to an experiment, the similar result can be obtained by the use of a composite permanent magnet which has an inverse polarity from that of the composite permanent magnet illustrated in FIG. 5.

Figure 6:
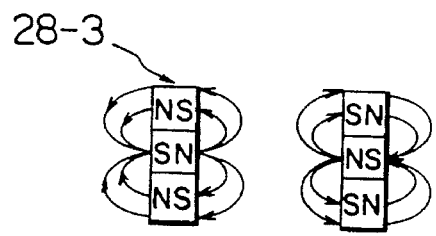
FIG. 6 is a view for showing still another example of the magnetic field generating device illustrated in FIG. 1.

Referring to FIG. 6, description will be made as regards yet another example of the magnetic field generating device 28. In this example, the cusp-shaped magnetic field is generated by a composite permanent magnet 28-3 which has a structure formed by stacking a plurality of annular permanent magnets. In this case, the permanent magnets are stacked so as to have an inverse polarity to each other between the permanent magnets adjacent to each other.

The permanent magnets illustrated in FIGS. 3 to 6 may not necessarily have a circular annular shape and may have, for example, a rectangular shape.

Figure 7:
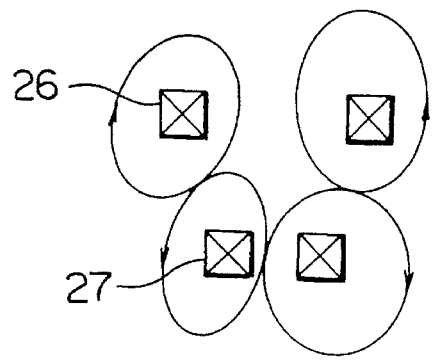
FIG. 7 is a view for showing yet another example of the magnetic field generating device illustrated in FIG. 1.

In FIG. 7, the magnetic field generating device 28 is composed of a first electromagnetic coil 26 which is located in the vicinity of the side of the plasma source and has a large diameter, and a second electromagnetic coil 27 which is located in the side of the anode and has a diameter smaller than that of the first electromagnetic coil 26. As apparent from lines of magnetic force indicated by arrows, the first and the second electromagnetic coils 26 and 27 are supplied with electric currents which are different, in polarity, from each other. Even with this structure, it is possible to generate the cusp-shaped magnetic field so as to be able to render the plasma beam into the semi-confinement state as similar as the cases of the permanent magnets illustrated in FIGS. 3 to 6.

Figure 8:
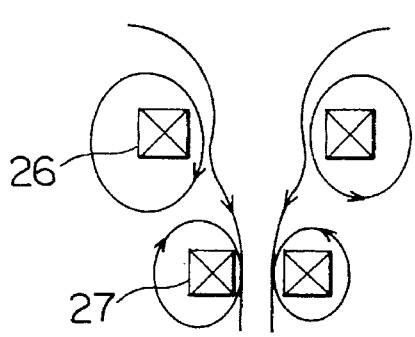
FIG. 8 is a view for showing a modification of the magnetic field generating device illustrated in FIG. 7.

Referring to FIG. 8, when the first and the second electromagnetic coils 26 and 27 are supplied with electric currents having the same polarity, a mirror-shaped magnetic field is generated. It is also possible by such a mirror-shaped magnetic field to render the plasma beam into the semi-confinement state.

Figure 9:
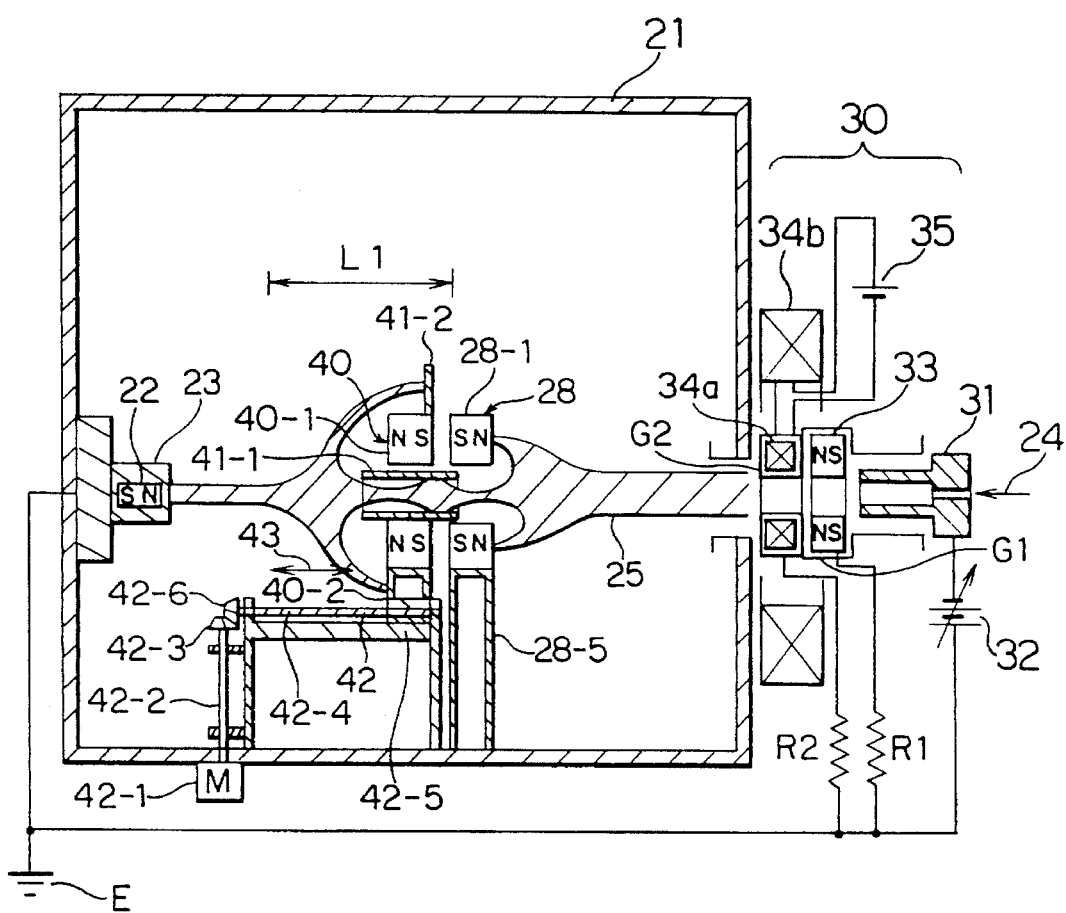
FIG. 9 is a sectional view of a plasma beam generating apparatus according to a second embodiment of this invention.

With reference to FIG. 9, description will now be made as regards a plasma beam generating apparatus according to a second embodiment of this invention. In FIG. 9, similar parts equivalent to those illustrated in FIG. 1 are designated by like reference numerals. In the plasma beam generating apparatus, the anode 23 is formed at a side wall of the chamber 21, which is opposite to the plasma source 30. Between the plasma source 30 and the anode 23, the magnetic field generating device 28 is arranged. Between the magnetic field generating device 28 and the anode 23, a magnetic field controlling device 40 is arranged in the vicinity of the magnetic field generating device 28.

The magnetic field generating device 28 comprises a ring-shaped permanent magnet 28-1. The permanent magnet 28-1 is magnetized in an axial direction and is mounted on a mounting table 28-5 with a central opening thereof corresponding to the orbit of the plasma beam 25. With the above-mentioned magnetic field generating device 28, a magnetic field having a cusp-shaped or a mirror-shaped magnetic gradient, along the plasma beam 25, is generated in the vicinity of the magnetic field generating device 28.

A flow of the plasma beam 25 is impeded at a side or both sides of the magnetic field generating device 28 by the above-mentioned magnetic gradient. This results in, as described in conjunction with FIG. 1, that the plasma beam 25 is brought into a semi-confinement state. The plasma beam in the semi-confinement state is rendered into a state that an electron density $n_e$ is higher than an ion density $n_i$ due to the thermal diffusion, namely, a state of $n_e \geq n_i$. This state causes the negative space charge to the electron flow. As a result, the discharge voltage is increased. Additionally, neutralizing gas and neutralizing particles are infused from an end portion of the confined plasma. As a result, a difference between the electron density and the ion density in a space becomes larger ($n_e > n_i$). This results in an increase of the discharge voltage.

Figure 10:
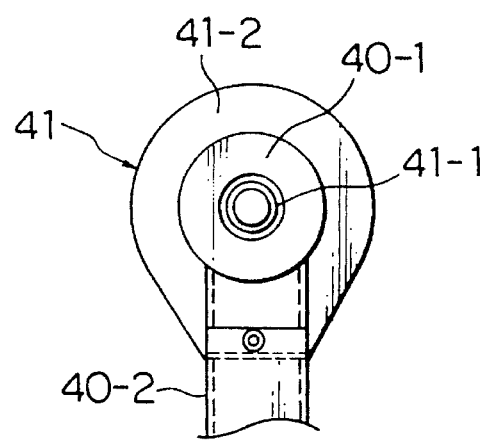
FIG. 10 is a view for showing a magnetic field controlling device in the plasma beam generating apparatus illustrated in FIG. 9.

As described above, in front of the magnetic field generating device 28, the magnetic field controlling device 40 is arranged. The magnetic field controlling device 40 comprises an annular permanent magnet 40-1. The permanent magnet 40-1 is magnetized in an axial direction to be located coaxially with the permanent magnet 28-1. The permanent magnet 40-1 may be called a second permanent magnet. As shown in FIG. 10 in detail, a shielding device 41 is formed between the permanent magnet 28-1 and the permanent magnet 40-1. The shielding device 41 extends in an axial direction and comprises a shielding pipe portion 41-1 and a flange portion 41-2. By the shielding device 41, an electron flow due to a return flux (return magnetic force) is shielded as will be described later.

The permanent magnet 40-1 is mounted on a mounting table 40-2. The mounting table 40-2 is movable by a driving system 42 in a direction indicated by an arrow line 43. The driving system 42 comprises a driving motor 42-1 arranged outside the chamber 21. The driving motor 42-1 has a driving axis 42-2 on which a bevel gear 42-3 is mounted. The driving system 42 also comprises an axial screw 42-4 extending in parallel with the plasma beam 25. The axial screw 42-4 is supported by a support table 42-5. At one end of the axial screw 42-4, a bevel gear 42-6 is fixed. The bevel gear 42-6 is engaged with the bevel gear 42-3. When the driving motor 42-1 is rotatively driven, the permanent magnet 40-1 with the mounting table 40-2 is moved along the axial screw 42-4.

As described above, a relative distance L1 between the permanent magnet 40-1 and the permanent magnet 28-1 varies with the movement of the permanent magnet 40-1. As a result, the magnetic gradient generated by the permanent magnet 28-1 is varied. That is, the longer the relative distance L1 becomes, the more gradually the magnetic gradient generated by the permanent magnet 28-1 is sloped. In other words, variation of the relative interval L brings variation of magnetic field strength because central magnetic field strength of the permanent magnet 28-1 is determined by a composition of a magnetic field on a central axis of the permanent magnet 40-1 and a magnetic field on a central axis of the permanent magnet 28-1.

Figure 11:
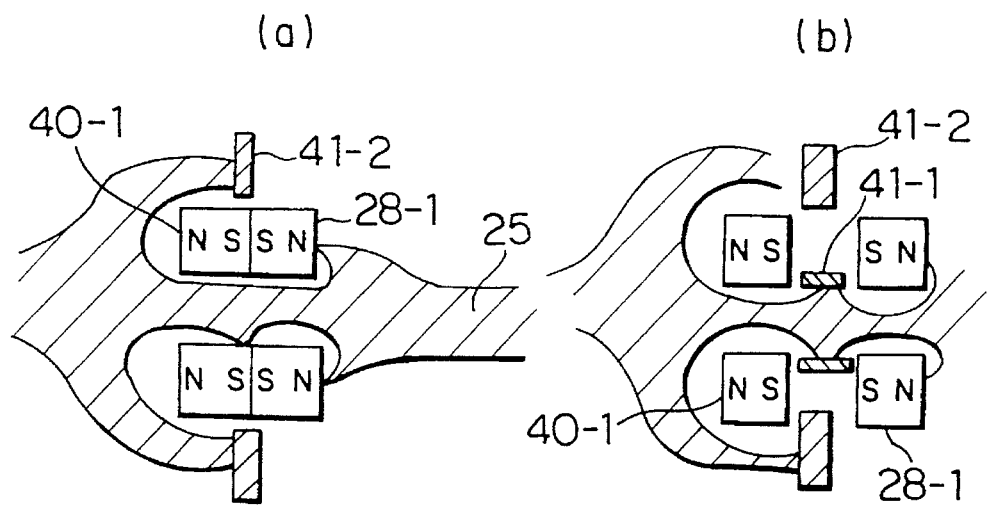
FIG. 11 is illustrations for describing an effect of the magnetic field controlling device shown in FIG. 9.

With reference to FIG. 11, it is supposed that the permanent magnet 28-1 and the permanent magnet 40-1 are arranged so that the same poles (for example, S poles) are faced to each other. As shown in FIG. 11(a), in a state that the permanent magnet 28-1 and the permanent magnet 40-1 are most approached to each other, each magnetic flux density of central portions of the permanent magnets 28-1 and 40-1 is decreased. As a result, the magnetic gradient is gradually sloped, so that a diameter of the plasma beam 25 becomes large. This means that the discharge voltage is decreased. Additionally, in the state illustrated in FIG. 11(b), the shielding pipe portion 41-1 is located within the central opening of the permanent magnet 40-1. Furthermore, the flange portion 41-2 is positioned on a boundary between the permanent magnet 28-1 and the permanent magnet 40-1 so as to shield the electron flow due to the return flux.

As shown in FIG. 11(b), when the permanent magnet 40-1 is moved so that the permanent magnet 40-1 and the permanent magnet 28-1 are separated from each other, a mutual interference between both permanent magnets is decreased. This results in that the diameter of the plasma beam 25 becomes small to increase the discharge voltage. Moreover, when the permanent magnet 40-1 is further moved to go beyond a zero point of a magnetic field, at this point (the zero point of the magnetic field), another cusp-shaped magnetic field is generated. Accordingly, the discharge voltage is further increased. Additionally, in the state shown in FIG. 11(b), the flange portion 41-2 is positioned between the permanent magnet 28-1 and the permanent magnet 40-1 to shield the electron flow due to the return flux.

Figure 12:
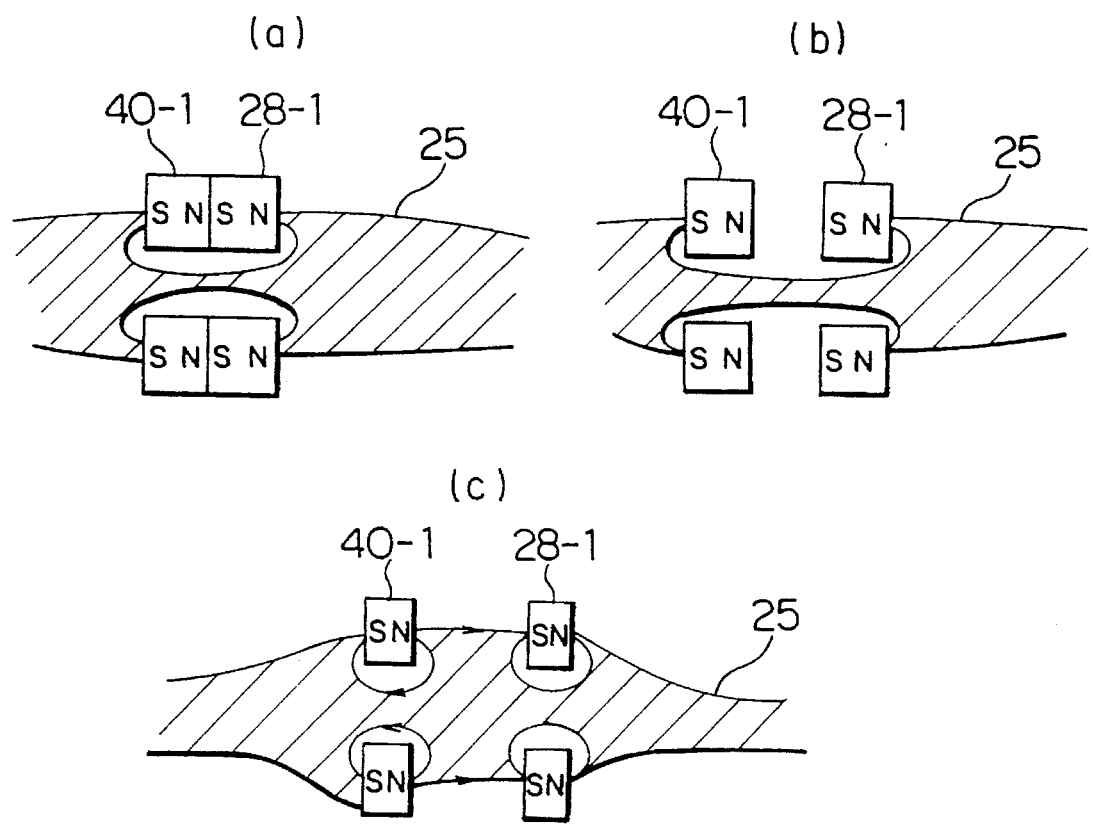
FIG. 12 is illustrations for describing an effect of another example of the magnetic field controlling device in the plasma beam generating apparatus shown in FIG. 9.

In FIG. 12, it is supposed here that the permanent magnet 28-1 and the permanent magnet 40-1 are arranged so that different poles are faced to each other. In addition, the shielding device 41 is omitted in FIG. 12. As shown in FIG. 12(a), in a state that the permanent magnet 28-1 and the permanent magnet 40-1 are most approached to each other, each magnetic flux density of the central portions of the permanent magnets 28-1 and 40-1 is increased, so that the magnetic gradient becomes steep. As a result, the diameter of the plasma beam 25 becomes small to increase the discharge voltage. As shown in FIG. 12(b), when the permanent magnet 40-1 is moved so as to separate the permanent magnet 40-1 from the permanent magnet 28-1, a mutual interference between both permanent magnets is decreased. Namely, a magnetic flux density is decreased, so that the diameter of the plasma beam 25 becomes large. This results in a decrease of the discharge voltage. When the permanent magnet 40-1 is further moved, as shown in FIG. 12(c), to go beyond a zero point of a magnetic field, two cusp-shaped magnetic fields are generated to increase the discharge voltage. The plasma beam which passed through the permanent magnets 28-1 and 40-1 is guided by a permanent magnet 22 (FIG. 9) so as to reach the anode 23.

As described above, it is possible to vary the magnetic field strength so as to control the discharge voltage by moving the permanent magnet 40-1. In addition, the permanent magnet 40-1 may be moved only for a distance to a reverse point of the magnetic field. Thus, a moving range of the permanent magnet 40-1 may be the distance L1 shown in FIG. 9.

Although the description is made as regards an example that the permanent magnet 40-1 is located between the permanent magnet 28-1 and the anode 23, the permanent magnet 40-1 may be located between the permanent magnet 28-1 and the plasma source 30. Furthermore, the outer diameter and the inner diameter of the permanent magnet 40-1 may be formed larger than those of the permanent magnet 28-1 so that the permanent magnet 40-1 is located coaxially with the permanent magnet 28-1 and outside the outer surface of the permanent magnet 28-1. At any rate, the permanent magnet 40-1 may be arranged along the orbit of the plasma beam 25 and relatively moved with respect to the permanent magnet 28-1 so as to vary the magnetic field strength, namely, the magnetic gradient by the permanent magnet 28-1.

Figure 13:
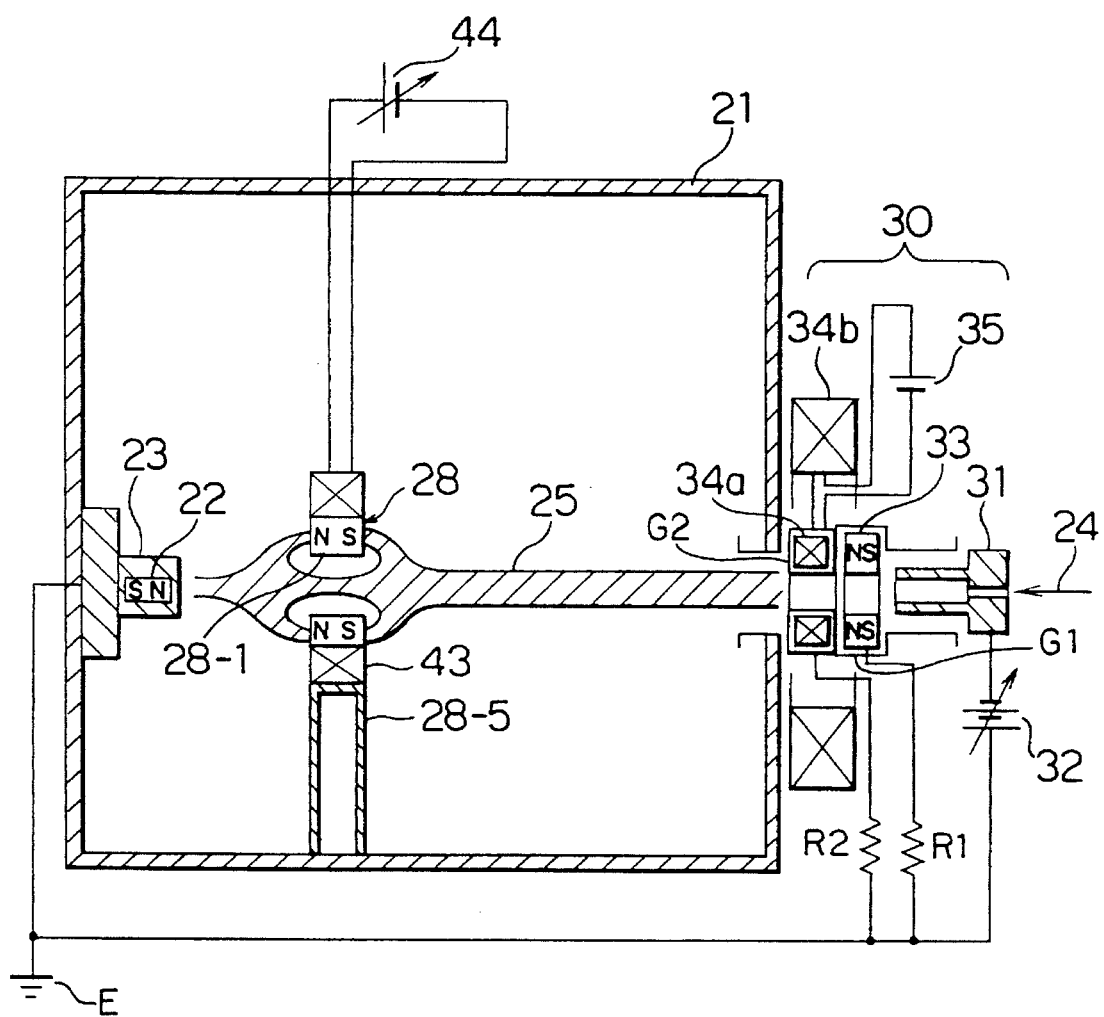
FIG. 13 is a sectional view for showing a modification of the plasma beam generating apparatus illustrated in FIG. 9.

With reference to FIG. 13, description will be made as regards a modification of the second embodiment of this invention. In the plasma beam generating apparatus, the permanent magnet 28-1 used as the magnetic field generating device 28 has the outer periphery being provided with an electromagnetic coil 43 therearound. The electromagnetic coil 43 serves, as will be described later, as a magnetic field controlling device.

Figure 14:
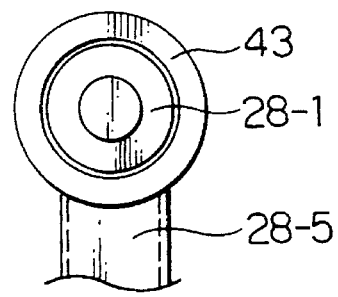
FIG. 14 is a view for showing a positional relationship between the magnetic field generating device and an electromagnetic coil in the plasma beam generating apparatus illustrated in FIG. 13.

Referring to FIG. 14 together with FIG. 13, the permanent magnet 28-1 and the electromagnetic coil 43 are integrally assembled to be mounted on a mounting table 28-5. The electromagnetic coil 43 is connected to a variable power supply 44 to be excited.

As described above, the plasma beam 25 is confined by the cusp-shaped magnetic field generated by the permanent magnet 28-1, so that the discharge voltage is increased. In this event, a magnetic field (will be later called an impeding magnetic field) is generated by the electromagnetic coil 43 so that the magnetic gradient of the cusp-shaped magnetic field becomes gentle by the impeding magnetic field. As a result, a confinement effect to the plasma beam 25 is decreased. In other words, the flow of the plasma beam 25 becomes preferable so that the increase of the discharge voltage is impeded.

Strength of the above-mentioned impeding magnetic field is controlled by controlling the electric current which is supplied from the variable power supply 44 to the electromagnetic coil 43. In accordance with the variation of the strength of the impeding magnetic field, the magnetic gradient of the cusp-shaped magnetic field is varied. The discharge voltage is thereby controlled.

Incidentally, in the modification illustrated in FIG. 13, description was made as regards an example that the electromagnetic coil 43 is arranged at the outer periphery of the permanent magnet 28-1. However, a variety of positional relationship between the permanent magnet 28-1 and the electromagnetic coil 43 can be determined. For example, as illustrated in FIGS. 15 and 16, a coil having the identical inner and outer diameters as those of the permanent magnet 28-1 is used as the electromagnetic coil 43. In FIG. 15, the electromagnetic coil 43 is arranged coaxially with the permanent magnet 28-1 so as to be close to the left edge surface (the side surface at the side of the anode) of the permanent magnet 28-1. In this event, it is supposed that the center of the permanent magnet 28-1 is depicted at P and that a distance from the right edge surface of the electromagnetic coil 43 to the center P is represented by Lx. The outer diameter of the electromagnetic coil 43 is represented by D. In this case, the distance Lx and the outer diameter D are defined by an inequality given by: $Lx \leq D$.

In FIG. 16, the permanent magnet 28-1 and the electromagnetic coil 43 are coaxially arranged with having an interval therebetween. In this case also, a relationship between the permanent magnet 28-1 and the electromagnetic coil 43 is defined by $Lx \leq D$.

Similarly, as shown in FIG. 17, a coil having an inner diameter larger than an outer diameter of the permanent magnet 28-1 may be used as the electromagnetic coil 43. The electromagnetic coil 43 is located coaxially with the permanent magnet 28-1 so as to overlap each other.

Referring to FIG. 18, the electromagnetic coil 43 is displaced on the side of the anode. Furthermore, in FIG. 19, the electromagnetic coil 43 is displaced on the side of the plasma source.

Figure 20:
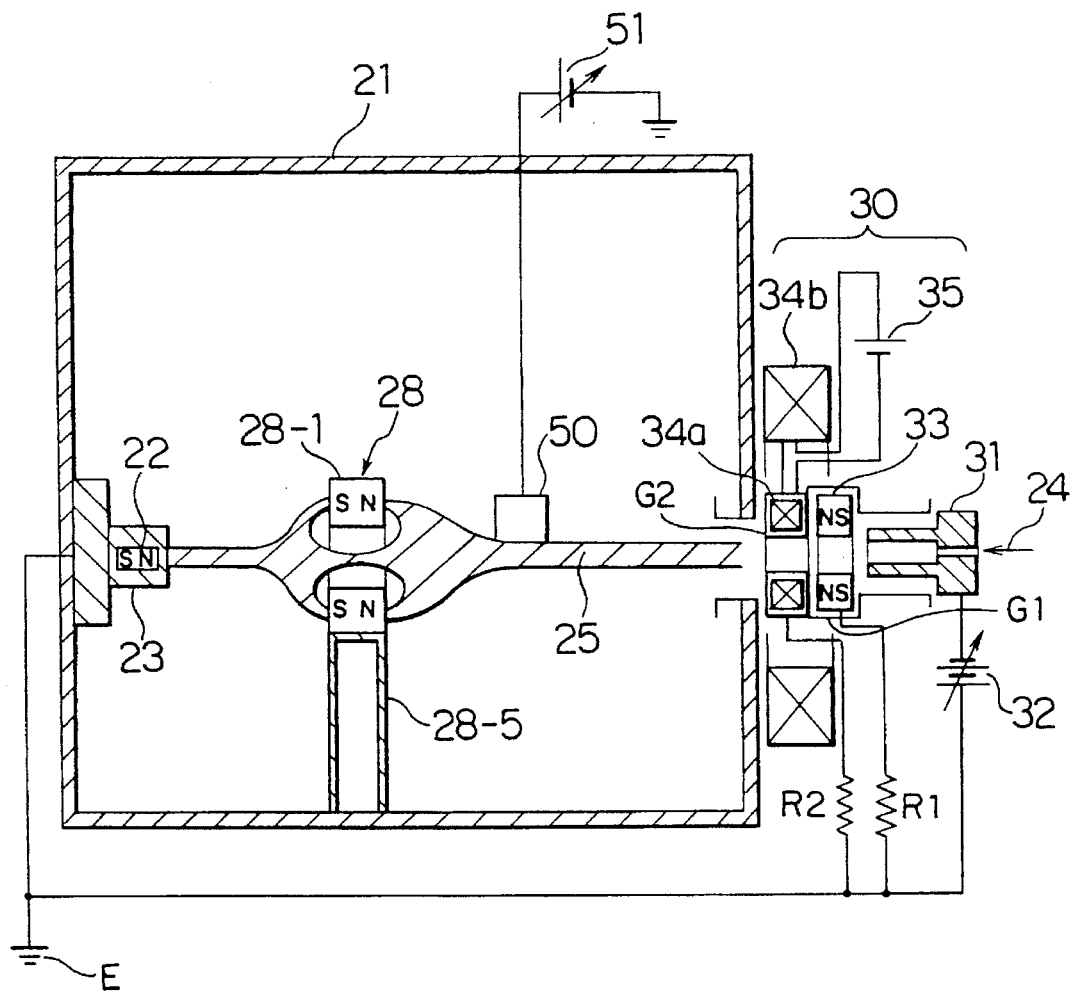
FIG. 20 is a sectional view for showing a plasma beam generating apparatus according to a third embodiment of this invention.
Figure 21:
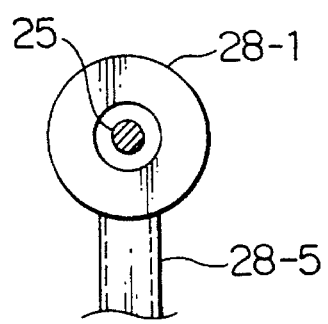
FIG. 21 is a front view for showing a structure of the magnetic field generating device illustrated in FIG. 20.

With reference to FIG. 20, description will now be made as regards a plasma beam generating apparatus according to a third embodiment of this invention. This embodiment is similar as FIG. 9 except that a discharge voltage controlling electrode 50 is provided to the equipment in place of the magnetic field controlling device 40. The magnetic field generating device 28 is, as illustrated in FIG. 21, supported by a mounting table 28-5 which is fixed on the bottom of the chamber 21 so that the plasma beam 25 is capable of passing through the central portion of the annular permanent magnet 28-1. By the permanent magnet 28-1, a magnetic gradient which rapidly varies along the orbit of the plasma beam 25 is generated. Since the electron flow is impeded by the magnetic gradient, the plasma beam 25 is rendered, in this portion, into the semi-confinement state. In the plasma beam 25 in this state, the electron density becomes higher than the ion density due to the thermal diffusion so that the discharge voltage is increased.

The electrode 50 is located at a position where the electrode can be brought into contact with the plasma beam 25 within the chamber 21 or the electrode can enter inside the plasma beam. The electrode 50 is supplied with a bias voltage from a variable-voltage bias power supply 51. In a state that the magnetic gradient is uniform, the electron density within the beam is varied by varying the bias voltage applied to the electrode 50 which is kept in contact with the plasma beam 25. In accordance with the variation of the electron density, a gradient of the electron density becomes gentle, so that the discharge voltage is varied. According to a characteristic of the plasma beam, the discharge voltage is varied by the electron density. It is therefore possible to control the discharge voltage or an electric current by varying the bias voltage. The electrode 50 may have any shape as far as the electrode is brought into contact with the plasma beam 25 and an arranged position thereof is not restricted to the position illustrated in FIG. 20. Some modifications will be described with reference to FIGS. 22 and 23.

Figure 22:
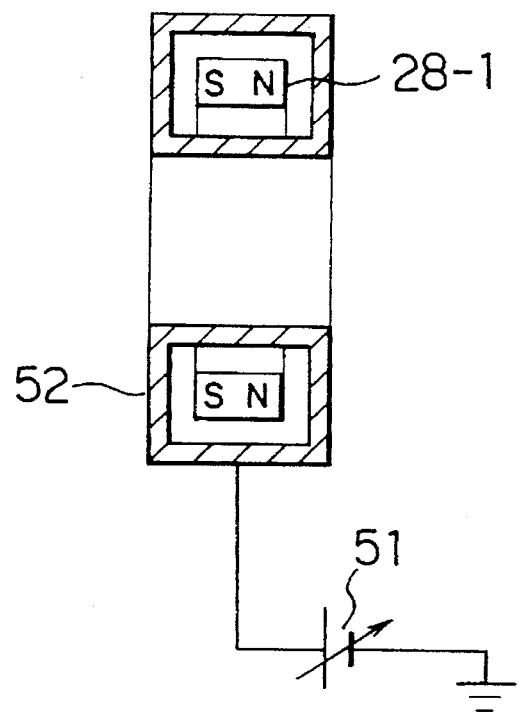
FIG. 22 is a sectional view for showing another combination of the magnetic field generating device and a discharge voltage controlling electrode illustrated in FIG. 20.

In FIG. 22, the permanent magnet 28-1 for generating the cusp-shaped magnetic gradient is surrounded by a conductor case 52. The conductor case 52 is connected to the bias power supply 51. The conductor case 52 serves as the electrode 50 illustrated in FIG. 20.

Figure 23:
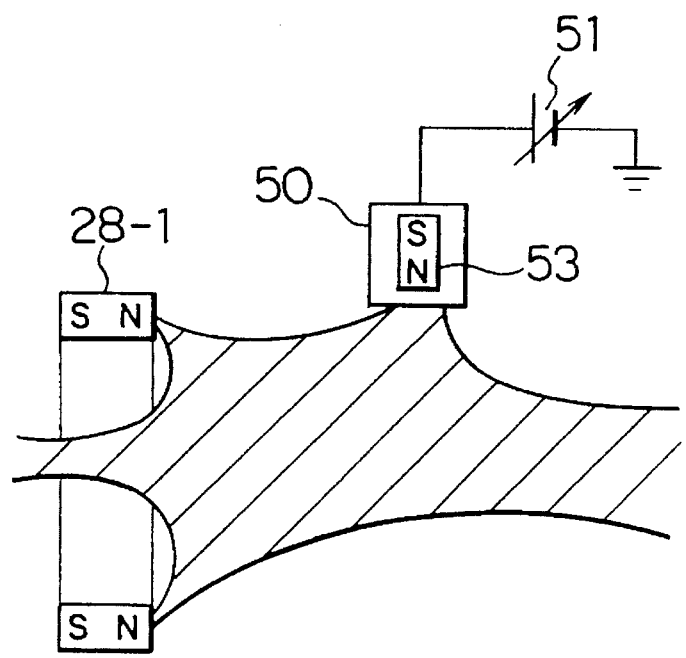
FIG. 23 is a sectional view for showing still another combination of the magnetic field generating device and the discharge voltage controlling electrode illustrated in FIG. 20.

Referring to FIG. 23, a permanent magnet 53 for attracting the plasma is embedded into the electrode 50 so as to be thereby capable of being stably brought into contact with the plasma. The permanent magnet 53 may be called a third permanent magnet.

The plasma beam generating apparatus according to this invention is suitable for ion plating, plasma etching, plasma cleaning, plasma dissolution and so on. In the ion plating, an evaporation metal is mounted on the anode 23. In the chamber 21, a substrate to be treated is arranged with being applied with a negative voltage. The evaporation metal is heated by the plasma beam and evaporates. Evaporated metallic particles are ionized by the plasma beam to be deposited on the substrate and form a coated film. In the plasma etching, the plasma cleaning, and the plasma dissolution, an object to be treated is mounted on the anode 23.

Description was above made as regards this invention through some preferable embodiments. This invention is not restricted to these embodiments. For example, in the plasma beam generating apparatus illustrated in FIG. 20, the magnetic field controlling device 40 shown in FIG. 9 may be located between the anode 23 and the permanent magnet 28-1.

What is claimed is:

1. A plasma beam generating apparatus comprising:

a chamber for defining a discharge space;

a plasma source mounted on said chamber to generate a plasma beam;

an anode portion arranged within said chamber to receive said plasma beam;

acceleration magnetic field generating means comprising a ring-shaped first permanent magnet arranged so as to surround an orbit of said plasma beam to provide the orbit of said plasma beam with a magnetic field having a magnetic gradient such that space charges are generated, said acceleration magnetic field generating means accelerating electron flow in said plasma beam to supply accelerated electron flow to said anode portion; and magnetic field controlling means arranged within said chamber for controlling said magnetic gradient by varying strength of the magnetic field generated by said acceleration magnetic field generating means, said magnetic field controlling means comprising a ring-shaped control magnetic field generating means arranged so as to surround the orbit of said plasma beam.

2. A plasma beam generating apparatus as claimed in claim 1, wherein said acceleration magnetic field generating means generates, as said magnetic field, a cusp-shaped magnetic field.

3. A plasma beam generating apparatus as claimed in claim 1, wherein said magnetic field controlling means comprises a second permanent magnet and moving means for varying a relative positional relationship between said second permanent magnet and said first permanent magnet.

4. A plasma beam generating apparatus as claimed in claim 2, wherein said magnetic field controlling means comprises a second permanent magnet and moving means for varying a relative positional relationship between said second permanent magnet and said first permanent magnet.

5. A plasma beam generating apparatus as claimed in claim 4, wherein said second permanent magnet is located coaxially with said first permanent magnet, said moving means moving said second permanent magnet along the orbit of said plasma beam.

6. A plasma beam generating apparatus as claimed in claim 5, further comprising a shielding device, between said first permanent magnet and said second permanent magnet, for shielding electron flow by return flux from said first permanent magnet to said second permanent magnet.

7. A plasma beam generating apparatus as claimed in claim 6, wherein said first permanent magnet and said second permanent magnet are located between said plasma source and said anode portion.

8. A plasma beam generating apparatus as claimed in claim 1, wherein said control magnetic field generating means comprises an electromagnetic coil arranged in a vicinity of said first permanent magnet, and a variable power supply means for controlling electric current which is supplied to said electromagnetic coil.

9. A plasma beam generating apparatus as claimed in claim 2, wherein said control magnetic field generating means comprises an electromagnetic coil arranged in a vicinity of said first permanent magnet, and a variable power supply means for controlling electric current which is supplied to said electromagnetic coil.

10. A plasma beam generating apparatus as claimed in claim 8, wherein said electromagnetic coil is located coaxially with said first permanent magnet.

11. A plasma beam generating apparatus as claimed in claim 9, wherein said electromagnetic coil is located coaxially with said first permanent magnet.

12. A plasma beam generating apparatus as claimed in claim 10, wherein said first permanent magnet and said electromagnetic coil are located between said plasma source and said anode portion.

13. A plasma beam generating apparatus as claimed in claim 11, wherein said first permanent magnet and said electromagnetic coil are located between said plasma source and said anode portion.

* * * * *